United States Patent
Mohamed et al.

(10) Patent No.: US 9,154,094 B2
(45) Date of Patent: Oct. 6, 2015

(54) EFFICIENT POWER AMPLIFICATION OVER LARGE OPERATING AVERAGE POWER RANGE

(71) Applicant: Telefonaktiebolaget L M Ericsson (publ), Stockholm (SE)

(72) Inventors: Ahmed Mohamed Mahmoud Mohamed, Waterloo (CA); Slim Boumaiza, Waterloo (CA); Edward Sich, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 57 days.

(21) Appl. No.: 14/051,801

(22) Filed: Oct. 11, 2013

(65) Prior Publication Data

US 2014/0347125 A1    Nov. 27, 2014

Related U.S. Application Data

(60) Provisional application No. 61/825,638, filed on May 21, 2013.

(51) Int. Cl.
*H03F 3/60* (2006.01)
*H03F 1/02* (2006.01)

(52) U.S. Cl.
CPC .............. *H03F 3/602* (2013.01); *H03F 1/0288* (2013.01)

(58) Field of Classification Search
CPC .......... H03F 3/68; H03F 3/191; H03F 1/0288
USPC ................................. 330/295, 305
See application file for complete search history.

(56) References Cited

U.S. PATENT DOCUMENTS

| | | | |
|---|---|---|---|
| 6,472,934 B1 | 10/2002 | Pehlke | |
| 7,009,455 B2 * | 3/2006 | Toncich et al. | ............... 330/305 |
| 7,525,388 B2 * | 4/2009 | Liu et al. | ........................ 330/296 |
| 7,719,364 B2 * | 5/2010 | Kawanabe et al. | ........... 330/302 |
| 2008/0068078 A1 | 3/2008 | Iwasaki | |
| 2011/0204974 A1 | 8/2011 | Woo et al. | |
| 2011/0279178 A1 | 11/2011 | Outaleb et al. | |
| 2012/0092074 A1 | 4/2012 | Yanduru et al. | |
| 2012/0176194 A1 | 7/2012 | Kim et al. | |

FOREIGN PATENT DOCUMENTS

EP    2141798 A1    1/2010

OTHER PUBLICATIONS

Colantonio, Paolo et al., "The Doherty Power Amplifier," Advanced Microwave Circuits and Systems, Chapter 6, InTech, Apr. 2010, 27 pages.

(Continued)

*Primary Examiner* — Steven J. Mottola
(74) *Attorney, Agent, or Firm* — Withrow & Terranova, PLLC

(57) ABSTRACT

Embodiments of a Doherty power amplifier that maintain efficiency over a large operating average power range are disclosed. In one embodiment, the Doherty power amplifier includes reconfigurable main and auxiliary output matching networks and a fixed combining network. The reconfigurable main and auxiliary output matching networks can be reconfigured such that together the reconfigurable main output matching network, the reconfigurable auxiliary output matching network, and the fixed combining network provide proper load modulation for multiple different back-off power levels. As a result, the Doherty power amplifier maintains high efficiency over an extended back-off power level range.

17 Claims, 10 Drawing Sheets

(56) References Cited

OTHER PUBLICATIONS

Darraji, Ramzi et al., "Digital Doherty Amplifier With Enhanced Efficiency and Extended Range," IEEE Transactions on Microwave Theory and Techniques, vol. 59, No. 11, Nov. 2011, 12 pages.

Doherty, W.H., "A New High-Efficiency Power Amplifier for Modulated Waves," Bell System Technical Journal, vol. 15, Issue 3, Jul. 1936, pp. 469-475.

Gustafsson, David et al., "A Modified Doherty Power Amplifier With Extended Bandwidth and Reconfigurable Efficiency," IEEE Transactions on Microwave Theory and Techniques, vol. 61, No. 1, Jan. 2013, 10 pages.

Wu, David Yu-Ting et al., "A Modified Doherty Configuration for Broadband Amplification Using Symmetrical Devices," IEEE Transactions on Microwave Theory and Techniques, vol. 60, No. 10, Oct. 2012, 13 pages.

Mahmoud Mohamed, A.M. et al., "Reconfigurable Doherty Power Amplifier for Multifrequency Wireless Radio Systems," IEEE Transactions on Microwave Theory and Techniques, vol. 61, Issue 4, Apr. 2013, IEEE, pp. 1588-1598.

International Search Report and Written Opinion for PCT/IB2014/061159, mailed Aug. 18, 2014, 12 pages.

\* cited by examiner

EFFICIENT POWER AMPLIFICATION OVER LARGE OPERATING AVERAGE POWER RANGE

RELATED APPLICATION

This application claims the benefit of provisional patent application Ser. No. 61/825,638, filed May 21, 2013, the disclosure of which is hereby incorporated herein by reference in its entirety.

FIELD OF THE DISCLOSURE

The present disclosure relates to a Doherty power amplifier and, in particular, relates to a Doherty power amplifier providing efficient power amplification over a large operating average power range.

BACKGROUND

The Doherty power amplifier was first proposed in 1936 by W. H. Doherty his article Doherty, W. H., "A New High Efficiency Power Amplifier for Modulated Waves," *Proceedings of Institute of Radio Engineers*, pp. 1163-1182, September 1936. While the Doherty power amplifier initially had success using vacuum tube amplifiers, the Doherty power amplifier essentially ceased to exist starting in the 1960s and 1970s with the introduction of solid state transistors. In particular, the Doherty amplifier requires precise matching between the main and auxiliary amplifiers. However, due to tolerances in solid state transistors, the required matching between the main and auxiliary amplifiers could not be achieved, which in turn caused Doherty power amplifiers implemented using solid state transistors to cease to operate as intended.

With the advent of digital signal processing and, in particular, digital predistortion, Doherty power amplifiers have recently reemerged as a power amplifier of choice, especially for base stations in cellular communications networks. Specifically, digital signal processing, such as digital predistortion, can now be utilized to compensate for mismatches between the main and auxiliary amplifiers. As a result, Doherty power amplifiers can now be implemented using solid state transistors. Due to the significant improvement in the efficiency of the Doherty power amplifier as compared to other power amplifier architectures, Doherty power amplifiers are now the preferred amplifiers for modern cellular communications standards, which have a high Peak-to-Average Power Ratio (PAPR).

One issue with existing Doherty power amplifier architectures is that they have a limited back-off power level in which the efficiency of the Doherty power amplifier is maintained. Typically, the back-off power level is 6-8 decibels (dB) such that the Doherty power amplifier is efficient for power levels from its maximum power level to 6-8 dB below its maximum power level. However, existing Doherty power amplifiers have poor efficiency when operated considerably below their limited back-off power level.

The limited back-off power level in existing Doherty power amplifiers is problematic because the average power of future base stations is expected to fluctuate in a range of up to 20 dB. This will lead to inefficient power amplification during most of the transmission time of the base station if an existing Doherty power amplifier, which has a back-off power level of 6-8 dB, is used.

In the paper Darraji, R. et al., "Digital Doherty Amplifier With Enhanced Efficiency and Extended Range," *IEEE Transactions on Microwave Theory and Techniques*, Vol. 59, No. 11, pp. 2898-2909, November 2011, the authors proposed a Doherty power amplifier that utilizes a digitally controlled dynamic input power distribution scheme that extends the back-off power level range in which the Doherty power amplifier maintains high efficiency. While this technique was initially sought to mitigate the imperfect load modulation mechanism due to the difference in class of operations of the carrier and peaking amplifiers, the consequential early saturation of the carrier amplifier resulted in a theoretical extension of the efficiency range by 3dB at best. This efficiency range extension is insufficient to tackle the significant efficiency deterioration for an important variation of the input average power level.

In the paper Gustafsson, D. et al., "A Modified Doherty Power Amplifier with Extended Bandwidth and Reconfigurable Efficiency," *IEEE Transactions on Microwave Theory and Techniques*, Vol. 61, No. 1, pp. 533-542, January 2013, the authors proposed a Doherty power amplifier in which the power back-off level can be reconfigured by changing the drain-source bias of the main amplifier. However, this technique suffers from three performance issues and an architectural issue. Specifically, regarding the performance issues, this technique suffers from: (1) a low power utilization factor when reconfigured for high PAPR levels, (2) low efficiency at reduced average input power levels, and (3) strong dynamic nonlinearity that can seriously compromise the ability to meet the standards specifications. As for the architectural issue, this technique requires two separate RF inputs so that separate baseband signal processing functions can be applied to each path to ensure correct Doherty operation at different frequencies. The additional RF input results in additional complexity from an architecture standpoint.

In light of the discussion above, there is a need for a new Doherty power amplifier having an extended back-off power level while also maintaining efficiency.

SUMMARY

Embodiments of a Doherty power amplifier that maintain efficiency over a large operating average power range are disclosed. In one embodiment, the Doherty power amplifier includes an input power divider having an input and two outputs, a main power amplifier branch having an input coupled to a first output of the input power divider and an output, an auxiliary power amplifier branch having an input coupled to a second output of the input power divider and an output, and a fixed combining network having a first input coupled to the output of the main power amplifier branch and a second input coupled to the output of the auxiliary power amplifier branch. The main power amplifier branch includes a main amplifier having a control input coupled to the first output of the input power divider and a reconfigurable main output matching network having an input coupled to an output of the main power amplifier and an output coupled to the first input of the fixed combining network. The auxiliary power amplifier branch includes an auxiliary power amplifier having a control input coupled to the second output of the input power divider and a reconfigurable auxiliary output matching network having an input coupled to the output of the auxiliary power amplifier and an output coupled to the second input of the fixed combining network.

In one embodiment, the reconfigurable main output matching network and the reconfigurable auxiliary output matching network are configurable such that proper load modulation is achieved for a number of different average operating power levels. Proper load modulation is the load modulation that allows the realization of the desired efficiency enhancement according to the Doherty technique. In one embodiment, for each of multiple predefined average input power levels, the reconfigurable main output matching network and the reconfigurable auxiliary output matching network are configurable such that together the reconfigurable main output matching network, the reconfigurable auxiliary output matching network, and the fixed combining network are equivalent to an optimal combining network for the Doherty power amplifier for the predefined average input power level.

In one embodiment, in addition to the reconfigurable main and auxiliary output matching networks, the Doherty power amplifier includes circuitry configured to provide a variable bias to the control input of the auxiliary power amplifier. In one embodiment, the circuitry is configurable to provide, for each predefined average input power level, a corresponding bias to the control input of the auxiliary power amplifier that causes the auxiliary power amplifier to begin to conduct at a proper power level. The proper power level of a desired power level above which the efficiency enhancement of the Doherty technique is to commence.

In one embodiment, the reconfigurable main output matching network and the reconfigurable auxiliary output matching network are dynamically reconfigured during operation of the Doherty power amplifier based on an actual average input power level of an input signal of the Doherty power amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a conventional Doherty power amplifier;

FIG. 2 graphically illustrates drain efficiency versus average input power level for a Doherty power amplifier having an extended back-off power level according to one embodiment of the present disclosure as compared to that of the conventional Doherty power amplifier of FIG. 1 and that of a modified version of the conventional Doherty power amplifier of FIG. 1 having an equivalent back-off power level;

FIG. 3 illustrates a Doherty power amplifier that maintains efficiency over a large average operating power level range according to one embodiment of the present disclosure;

FIG. 4 graphically illustrates current profiles of the main and auxiliary power amplifiers of the Doherty power amplifier of FIG. 3 for different average input power levels according to one embodiment of the present disclosure;

FIG. 5 illustrates an output impedance profile for the main amplifier of the Doherty power amplifier of FIG. 3 according to one embodiment of the present disclosure;

FIGS. 6A and 6B graphically illustrate a process by which the main and auxiliary output matching networks of the Doherty power amplifier of FIG. 3 can be designed to provide proper load modulation for a number of different average input power levels according to one embodiment of the present disclosure;

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
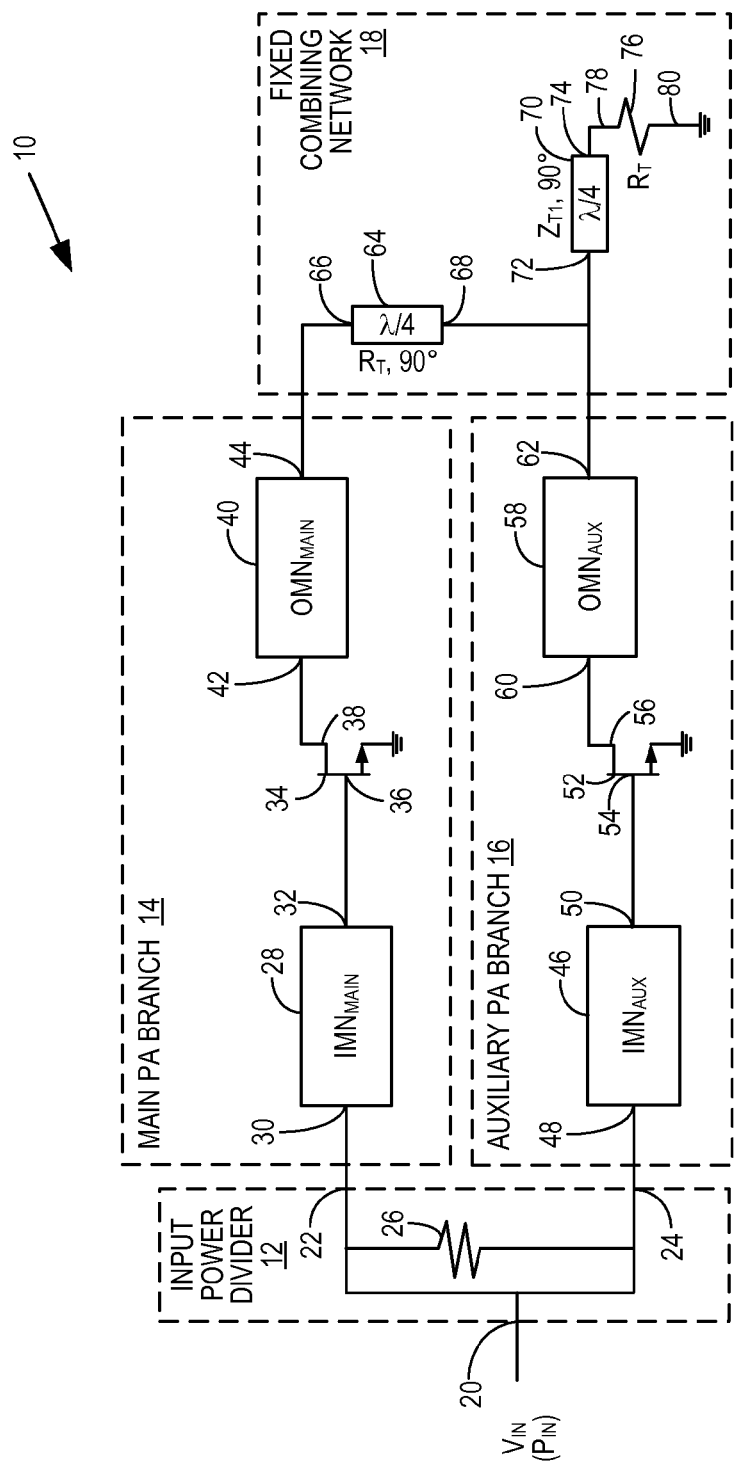

Embodiments of a Doherty power amplifier that maintain efficiency over a large operating average power range are disclosed. However, before discussing these embodiments, a discussion of a conventional Doherty power amplifier 10, as illustrated in FIG. 1, is beneficial. The conventional Doherty power amplifier 10 includes an input power divider 12, a main power amplifier (PA) branch 14, an auxiliary power amplifier branch 16, and an output combining network 18 connected as shown. The input power divider 12 is illustrated as having an input 20, two outputs 22 and 24, and a resistor 26 connected between the two outputs 22 and 24. The main power amplifier branch 14 includes a main input matching network ($IMN_{MAIN}$) 28 having an input 30 coupled to the first output 22 of the input power divider 12 and an output 32; a main power amplifier 34, which in this embodiment is a single transistor which may be referred to herein as a main transistor, having a control input 36 and an output 38; and a main output matching network ($OMN_{MAIN}$) 40 having an input 42 coupled to the output 38 of the main power amplifier 34 and an output 44. In a similar manner, the auxiliary power amplifier branch 16 includes an auxiliary input matching network ($IMN_{AUX}$) 46 having an input 48 coupled to the second output 24 of the input power divider 12 and an output 50; an auxiliary power amplifier 52, which in this embodiment is a single transistor which may be referred to herein as an auxiliary transistor, having a control input 54 and an output 56; and an auxiliary output matching network ($OMN_{AUX}$) 58 having an input 60 coupled to the output 56 of the auxiliary power amplifier 52 and an output 62.

The output combining network 18 includes a first impedance inverter 64, which in the illustrated embodiment is a quarter-wave transmission line, having a first terminal 66 coupled to the output 44 of the main output matching network ($OMN_{MAIN}$) 40 and a second terminal 68; a second impedance inverter 70, which in the illustrated embodiment is a quarter-wave transmission line, having a first terminal 72 coupled to the output 62 of the auxiliary output matching network ($OMN_{AUX}$) 58 and the second terminal 68 of the first impedance inverter 64 and a second terminal 74; and a resistor 76 having a first terminal 78 coupled to the second terminal 74 of the second impedance inverter 70 and a second terminal 80 coupled to ground.

In the main power amplifier branch 14, the main power amplifier 34 is Class AB biased and matched to ensure peak efficiency at a predetermined ρ dB back-off that corresponds to a Peak-to-Average Power Ratio (PAPR) of the input signal $$\left(\text{input voltage } V_{in} = \frac{V_{in,max}}{p}\right)$$

where $\rho$ (dB)=20 log(p). In the auxiliary power amplifier branch 16, the auxiliary power amplifier 52 is Class C biased and starts conducting at $$V_{in} = \frac{V_{in,max}}{p}.$$

The conventional Doherty power amplifier 10, which is referred to herein as a reference Doherty power amplifier, is designed to maintain high efficiency for input power levels between a peak input power $P_{in,max}$ and a reference average power level $$P_{in,avg}^{ref} = \frac{P_{in,max}}{p^2}$$

(Watts), which is equivalent to $P_{in,avg}^{ref} = P_{in,max} - \rho$ when expressed in dBm. Circuit parameters $R_T$ and $Z_{T1}$ of the conventional Doherty power amplifier 10 are given as follows:

$$R_T = R_T^{ref} = R_{opt}^{ref}, Z_{T1} = Z_{T1}^{ref} = \frac{R_{opt}^{ref}}{\sqrt{p}} \quad (1)$$

where $$R_{opt}^{ref} = \frac{V_{DS,max}}{I_{1,max}} \quad (2)$$

is selected to achieve a maximum voltage swing at the drain of the main power amplifier 34, which is Class AB biased, and $V_{DS,max}$ and $I_{1,max}$ represent a maximum drain bias of the main power amplifier 34 and a maximum drain current of the main power amplifier 34.

As is well understood in the art, the conventional Doherty power amplifier 10 maintains high efficiency over a range of input power levels from $P_{in,max}$ to $P_{in,max} - \rho$ (dB) using load modulation of an impedance seen by the main power amplifier 34 as a function of the input signal that follows the expression below:

$$Z_{main}^{ref} = \begin{cases} 2R_T^{ref} & 0 \le V_{in} \le \frac{V_{in,max}}{p} \\ R_T^{ref}\left(2 - \frac{1}{1+\sigma}\right) & \frac{V_{in,max}}{p} \le V_{in} \le V_{in,max} \end{cases} \quad (3)$$

where $$\sigma = \frac{V_{in}}{V_{in,max}} \quad (4)$$

Figure 2:
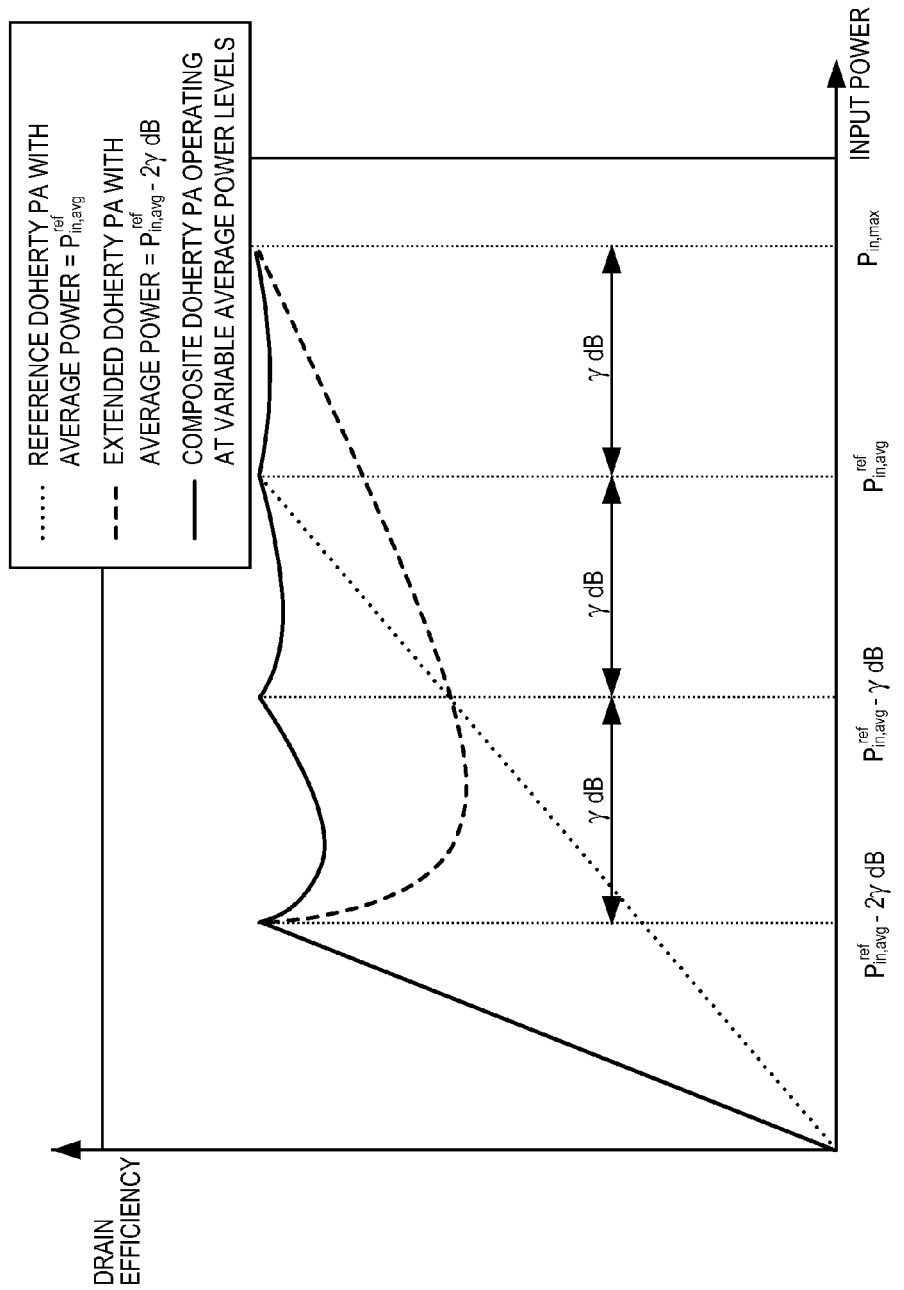

If the average input power of the input signal decreases as a result of, for example, network load change, the conventional Doherty power amplifier 10 will yield low average efficiency since load modulation is only maintained in the $\rho$ (dB) back-off range (i.e., in the input power range from $P_{in,max} - \rho$ (dB) to $P_{in,max}$). This efficiency degradation is illustrated in FIG. 2 by the curve labeled "Reference Doherty PA with Average Power=$P_{in,avg}^{ref}$." To improve the average efficiency, when the average input power is lower than $P_{in,avg}^{ref}$, proper load modulation has to be maintained over an extended back-off power range. One conceivable way to do this is to design the conventional Doherty power amplifier 10 for an extended back-off power level (i.e., increasing the back-off power level from $\rho$ to $\rho+2\gamma$). However, as also illustrated in FIG. 2, the conventional Doherty power amplifier 10 designed for the extended power back-off level of $\rho+2\gamma$ has substantially lower efficiency than the conventional Doherty power amplifier 10 designed for the conventional back-off level of $\rho$ for average input power levels greater than $P_{in,avg}^{ref}$.

Embodiments of a Doherty power amplifier that maintains high efficiency over an extended back-off power level range are disclosed. As discussed below in detail, in one embodiment, the Doherty power amplifier effectively adapts the circuit parameters $R_T$ and $Z_{T1}$ of the Doherty power amplifier as a function of an average input power of the input signal of the Doherty power amplifier. As illustrated in FIG. 2 by the curve labeled "Composite Doherty PA operating at Variable Average Power Levels," the Doherty power amplifier yields high efficiency over the entire range from the extended power back-off level ($P_{in,max} - (\rho+n\gamma)$ where in the example of FIG. 2 n=2) to $P_{in,max}$.

Figure 3:
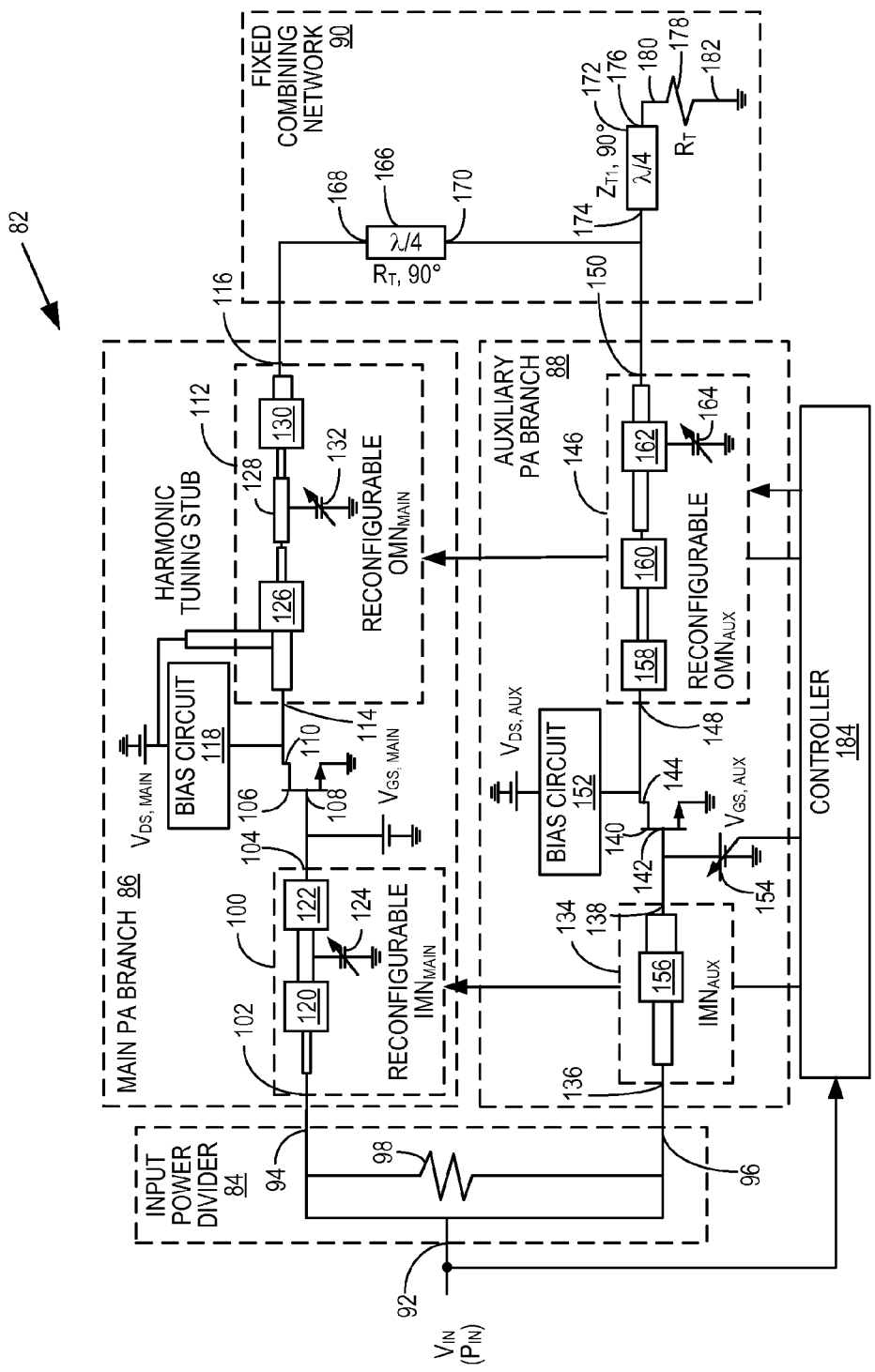

In this regard, FIG. 3 illustrates a Doherty power amplifier 82 according to one embodiment of the present disclosure. The Doherty power amplifier 82 includes an input power divider 84, a main power amplifier (PA) branch 86, an auxiliary power amplifier branch 88, and a fixed combining network 90 connected as shown. The input power divider 84 is illustrated as having an input 92, two outputs 94 and 96, and a resistor 98 connected between the two outputs 94 and 96. The main power amplifier branch 86 includes a reconfigurable main input matching network ($IMN_{MAIN}$) 100 having an input 102 coupled to the first output 94 of the input power divider 84 and an output 104; a main power amplifier 106, which in this embodiment is a single transistor which may be referred to herein as a main transistor, having a control input 108 and an output 110; and a reconfigurable main output matching network ($OMN_{MAIN}$) 112 having an input 114 coupled to the output 110 of the main power amplifier 106 and an output 116. In addition, the main power amplifier branch 86 includes a bias circuit 118 that couples a drain bias voltage ($V_{DS,MAIN}$) to the main power amplifier 106.

The reconfigurable main input matching network ($IMN_{MAIN}$) 100 includes transmission lines 120 and 122 and variable capacitance circuitry 124 connected as shown. In one embodiment, the transmission lines 120 and 122 are designed to provide proper input matching for the reference average input power level $P_{in,avg}^{ref}$. The variable capacitance circuitry 124 provides a variable capacitance to enable reconfiguration of the reconfigurable main input matching network ($IMN_{MAIN}$) 100 to provide proper phase matching between the main and auxiliary power amplifier branches 86 and 88 for the average input power levels. In one embodiment, the variable capacitance circuitry 124 is implemented as a fixed capacitor bank and a Radio Frequency (RF) Microelectromechanical (MEM) switch, where the MEM switch is controlled to vary the capacitance of the variable capacitance circuitry 124 by connecting to different capacitors in the fixed capacitor bank.

Similarly, the reconfigurable main output matching network ($OMN_{MAIN}$) 112 includes transmission lines 126, 128, and 130 and variable capacitance circuitry 132 connected as shown. In one embodiment, the transmission lines 126 through 130 are designed to provide proper output matching for the reference average input power level $P_{in,avg}^{ref}$. The variable capacitance circuitry 132 provides a variable capacitance to enable reconfiguration of the reconfigurable main output matching network (OMN$_{MAIN}$) 112. In one embodiment, the variable capacitance circuitry 132 is implemented as a fixed capacitor bank and a MEM switch, where the MEM switch is controlled to vary the capacitance of the variable capacitance circuitry 132 by connecting to different capacitors in the fixed capacitor bank. In this embodiment, the main power amplifier branch 86 also includes a harmonic tuning stub connected between the drain bias voltage V$_{DS,MAIN}$ and the transmission line 126 as shown.

In a similar manner, the auxiliary power amplifier branch 88 includes a fixed auxiliary input matching network (IMN$_{AUX}$) 134 having an input 136 coupled to the second output 96 of the input power divider 84 and an output 138; an auxiliary power amplifier 140, which in this embodiment is a single transistor which may be referred to herein as an auxiliary transistor, having a control input 142 and an output 144; and a reconfigurable auxiliary output matching network (OMN$_{AUX}$) 146 having an input 148 coupled to the output 144 of the auxiliary power amplifier 140 and an output 150. In addition, the auxiliary power amplifier branch 88 includes a bias circuit 152 that couples a drain bias voltage (V$_{DS,AUX}$) to the auxiliary power amplifier 140, and a variable voltage source 154 that provides a variable gate bias (V$_{GS,AUX}$) to the control input 142, which in this case is a gate, of the auxiliary power amplifier 140. Preferably, the auxiliary power amplifier 140 is Class C biased, whereas the main power amplifier 106 is Class AB biased.

The fixed auxiliary input matching network (IMN$_{AUX}$) 134 includes a transmission line 156 connected as shown. The reconfigurable auxiliary output matching network (OMN$_{AUX}$) 146 includes transmission lines 158, 160, and 162 and variable capacitance circuitry 164 connected as shown. In one embodiment, the transmission lines 158 through 162 are designed to provide proper output matching for the reference average input power level P$_{in,avg}^{ref}$. The variable capacitance circuitry 164 provides a variable capacitance to enable reconfiguration of the reconfigurable auxiliary output matching network (OMN$_{AUX}$) 146. In one embodiment, the variable capacitance circuitry 164 is implemented as a fixed capacitor bank and a MEM switch, where the MEM switch is controlled to vary the capacitance of the variable capacitance circuitry 164 by connecting to different capacitors in the fixed capacitor bank.

The fixed combining network 90 includes a first impedance inverter 166, which in the illustrated embodiment is a quarter-wave transmission line, having a first terminal 168 coupled to the output 116 of the reconfigurable main output matching network (OMN$_{MAIN}$) 112 and a second terminal 170; a second impedance inverter 172, which in the illustrated embodiment is a quarter-wave transmission line, having a first terminal 174 coupled to the output 150 of the reconfigurable auxiliary output matching network (OMN$_{AUX}$) 146 and the second terminal 170 of the first impedance inverter 166 and a second terminal 176; and a resistor 178 having a first terminal 180 coupled to the second terminal 176 of the second impedance inverter 172 and a second terminal 182 coupled to ground.

Lastly, the Doherty power amplifier 82 includes a controller 184 that adaptively configures the reconfigurable main input matching network (IMN$_{MAIN}$) 100, the reconfigurable main output matching network (OMN$_{MAIN}$) 112, the reconfigurable auxiliary output matching network (OMN$_{AUX}$) 146, and the variable voltage source 154 (and thus the variable gate bias (V$_{GS,AUX}$) of the auxiliary power amplifier 140) based on an input signal or, more particularly, an input power (P$_{IN}$) of the input signal, provided to the Doherty power amplifier 82. The controller 184 is implemented in hardware (e.g., an Application Specific Integrated Circuit (ASIC)) or a combination of hardware and software (e.g., a processor such as a Central Processing Unit (CPU) that executes software including instructions to control the processor to perform a predetermined algorithm for adaptively configuring the reconfigurable main input matching network (IMN$_{MAIN}$) 100, the reconfigurable main output matching network (OMN$_{MAIN}$) 112, the reconfigurable auxiliary output matching network (OMN$_{AUX}$) 146, and the variable voltage source 154 based on an input signal or, more particularly, an input power (P$_{IN}$) of the input signal).

In order to maintain high efficiency over an extended range of back-off power levels, the reconfigurable main output matching network (OMN$_{MAIN}$) 112 and the reconfigurable auxiliary output matching network (OMN$_{AUX}$) 146 are reconfigurable to provide proper load modulation for a number of back-off power levels P$_{in,avg}^{i}$=P$_{in,max}$−(ρ+iγ)=P$_{in,avg}^{ref}$−iγ dB for i=0,1, . . . , n, where n≥1 and, more preferably, n≥2. The average power reduction step γ corresponds to a reduction of the input signal V$_{in}$ by a ratio α, where γ (dB)=−20 log α. The ratio α is also referred to herein as a power reduction ratio. Specifically, circuit parameters R$_T$ and Z$_{T1}$ for the fixed combining network 90 are fixed values designed, in this embodiment, to provide proper load modulation (and thus maximum efficiency) for the back-off power level P$_{in,avg}^{ref}$=P$_{in,max}$−ρ dB, which is referred to herein as the reference back-off power level P$_{in,avg}^{ref}$=P$_{in,avg}^{0}$. Thus, the circuit parameters R$_T$ and Z$_{T1}$ for the fixed combining network 90 are given by Equations (1) and (2) above. However, each back-off power level P$_{in,avg}^{i}$ has corresponding optimal circuit parameters R$_{opt}^{i}$ and Z$_{opt}^{i}$ that provide proper load modulation for that back-off power level P$_{in,avg}^{i}$ defined as:

$$R_{opt}^{i} = \frac{R_{opt}^{ref}}{\alpha^{i}}, \quad Z_{opt}^{i} = \frac{R_{opt}^{i}}{\sqrt{p}}. \quad (5)$$

Figure 4:
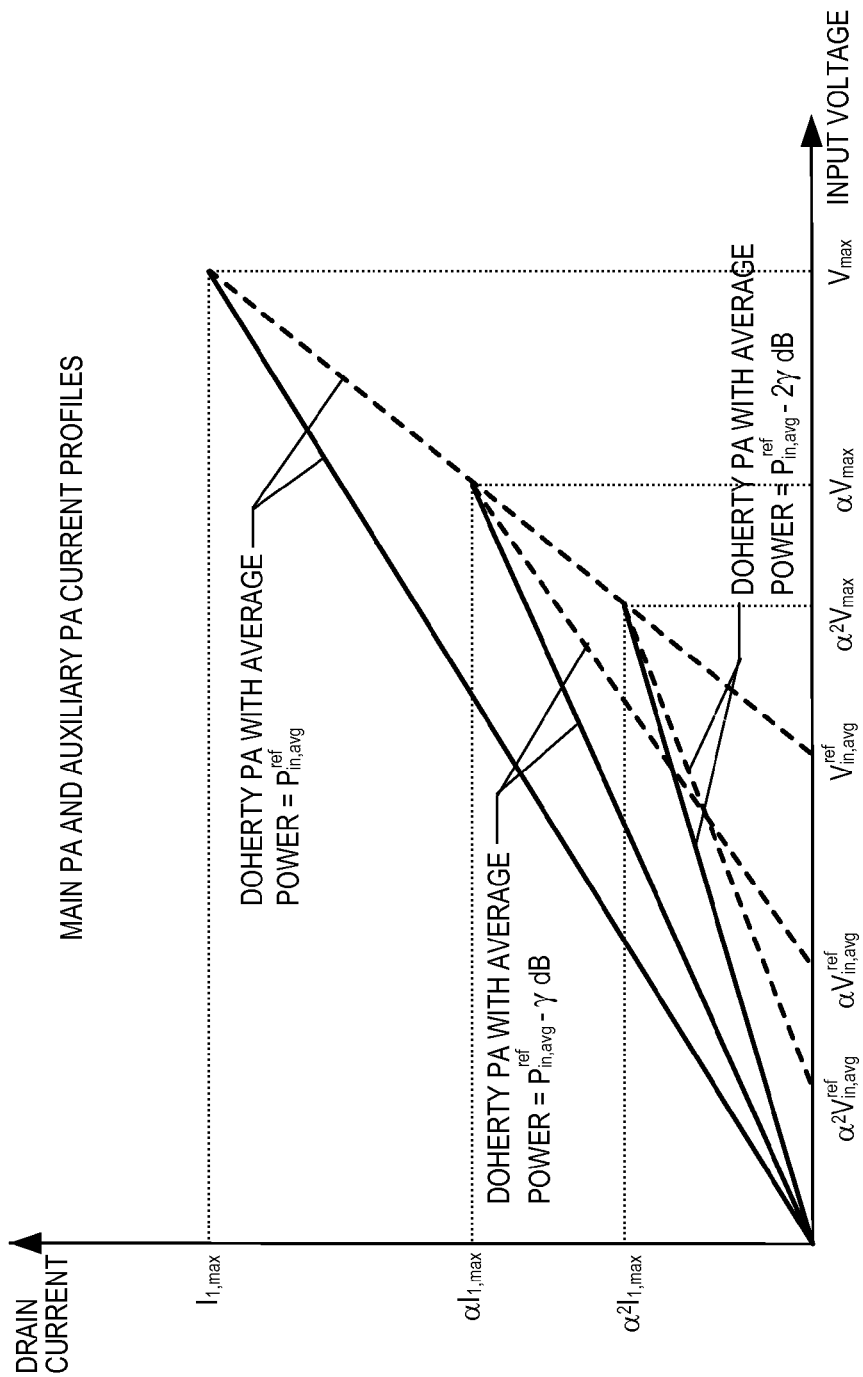

For instance, using P$_{in,avg}^{1}$=P$_{in,avg}^{ref}$−γ as an example, the drain current (I$_1$) of the main power amplifier 106 follows the input signal V$_{in}$ according to the equation:

$$I_1 = g_m V_{in}$$

assuming that the main power amplifier 106 has linear transconductance (g$_m$). At the back-off power level of P$_{in,avg}^{1}$, the drain current (I$_1$) of the main power amplifier 106 will be decreased by the ratio, or factor, α, hence I$_1$=αI$_{1,max}$. In this case, the auxiliary power amplifier 140 will be required to start conducting at a new threshold that is directly related to the back-off power level of P$_{in,avg}^{1}$. FIG. 4 demonstrates the desired current profiles for the main and auxiliary amplifiers 106 and 140 for proper load modulation at different operating power levels. In order to restore efficiency for the back-off power level of P$_{in,avg}^{1}$, the optimal load impedance to be seen by the main power amplifier 106 must vary from the reference value $$R_{opt}^{ref} \text{ to } \frac{R_{opt}^{ref}}{\alpha}.$$

Hence, based on Equation (5), proper load modulation is provided by, for each back-off power level P$_{in,avg}^{i}$, configuring the reconfigurable main output matching network (OMN$_{MAIN}$) 112 and the reconfigurable auxiliary output matching network (OMN$_{AUX}$) 146 such that the combination of the reconfigurable main output matching network (OMN$_{MAIN}$) 112, the reconfigurable auxiliary output matching network (OMN$_{AUX}$) 146, and the fixed combining network 90 provide the optimal load impedance to the main power amplifier 106. In other words, proper load modulation is provided by, for each back-off power level P$_{in,avg}^i$, configuring the reconfigurable main output matching network (OMN$_{MAIN}$) 112 and the reconfigurable auxiliary output matching network (OMN$_{AUX}$) 146 such that the combination of the reconfigurable main output matching network (OMN$_{MAIN}$) 112, the reconfigurable auxiliary output matching network (OMN$_{AUX}$) 146, and the fixed combining network 90 is equivalent to an optimal combining network for that back-off power level P$_{in,avg}^i$ where R$_T$=R$_{opt}^i$ and Z$_{T1}$=Z$_{opt}^i$. In addition, the variable voltage source 154 is controlled to provide the proper gate bias for the auxiliary power amplifier 140 to turn on at the appropriate input power level for the given back-off power level P$_{in,avg}^i$. The appropriate input power level at which the auxiliary power amplifier 140 turn on can be defined as:

$$V_{in} = \alpha^i V_{in,ref} = \alpha^i (V_{in,max}/p).$$

As a result, the Doherty power amplifier 82 maintains high efficiency at an average back-off power level up to nγ dB greater than the average back-off power level (P$_{in,avg}^{ref}$=P$_{in,max}$-ρ dB) of the conventional, or reference, Doherty power amplifier 10 of FIG. 1. Hence, a high drain efficiency of the Doherty power amplifier 82 is maintained over a wider range of back-off power levels.

In addition to reconfiguring the reconfigurable main output matching network (OMN$_{MAIN}$) 112, the reconfigurable auxiliary output matching network (OMN$_{AUX}$) 146, and the variable voltage source 154, the controller 184 also reconfigures the reconfigurable main input matching network (IMN$_{MAIN}$) 100 to provide phase balancing between the main and auxiliary power amplifier branches 86 and 88. More specifically, the controller 184 reconfigures the reconfigurable main input matching network (IMN$_{MAIN}$) 100 for each back-off power level to provide the proper phase correction for that back-off power level.

Figure 5:
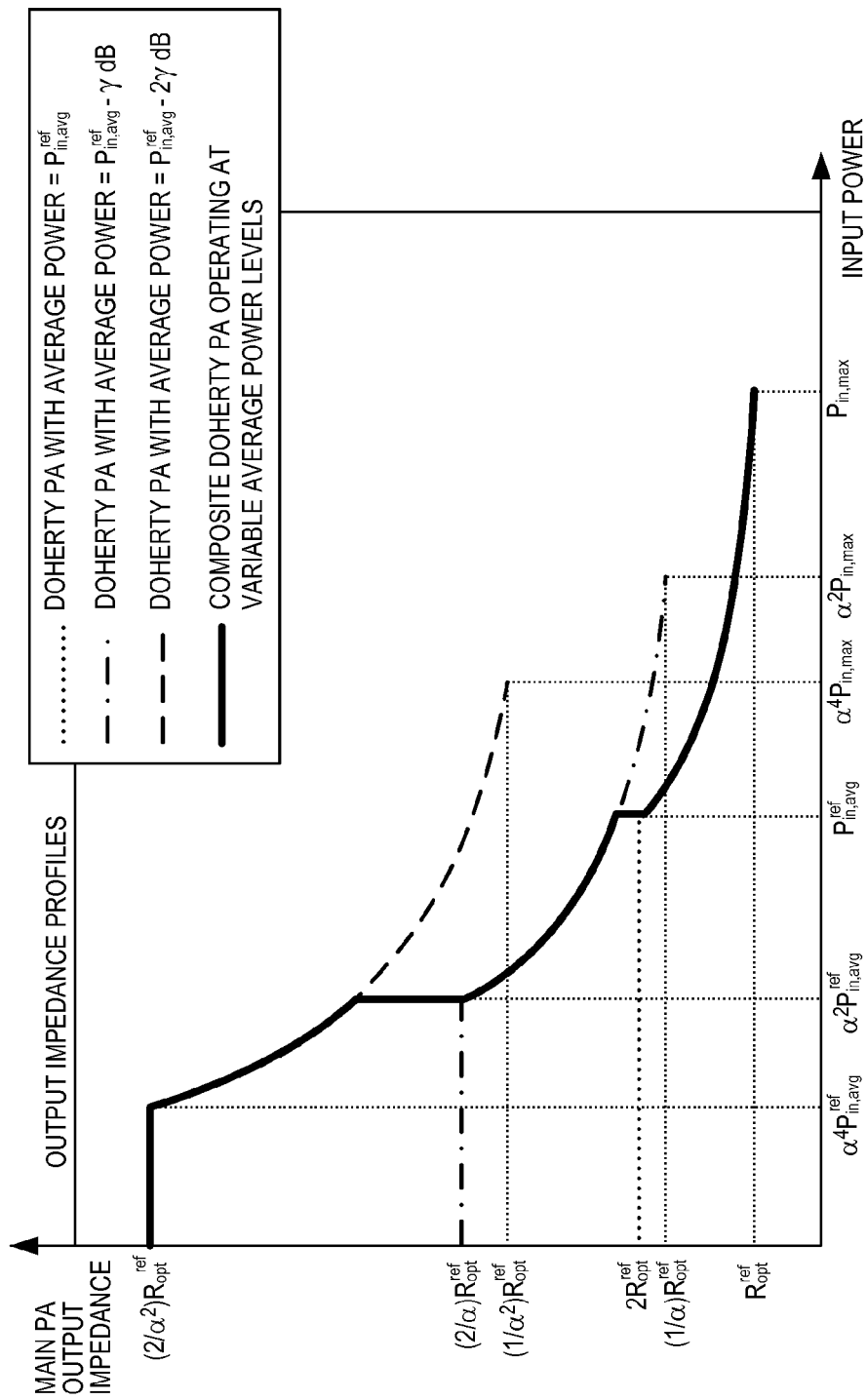

FIG. 5 illustrates an impedance profile for the output impedance of the Doherty power amplifier 82 of FIG. 3 according to one embodiment of the present disclosure. As illustrated, by reconfiguring the reconfigurable main output matching network (OMN$_{MAIN}$) 112 and the reconfigurable auxiliary output matching network (OMN$_{AUX}$) 146, the load impedance of the main power amplifier 106 is controlled to provide proper load modulation and, as a result, the Doherty power amplifier 82 maintains high efficiency over the extended back-off power level range. Specifically, reconfiguration of the main and auxiliary output matching networks (OMN$_{MAIN}$ and OMN$_{AUX}$) 112 and 146 ensures proper main transistor impedance and current profiles as illustrated in FIGS. 3 and 4 and, consequently, proper load modulation. By providing proper load modulation, the Doherty power amplifier 82 maintains high efficiency over the extended back-off power level range.

Figure 6A:
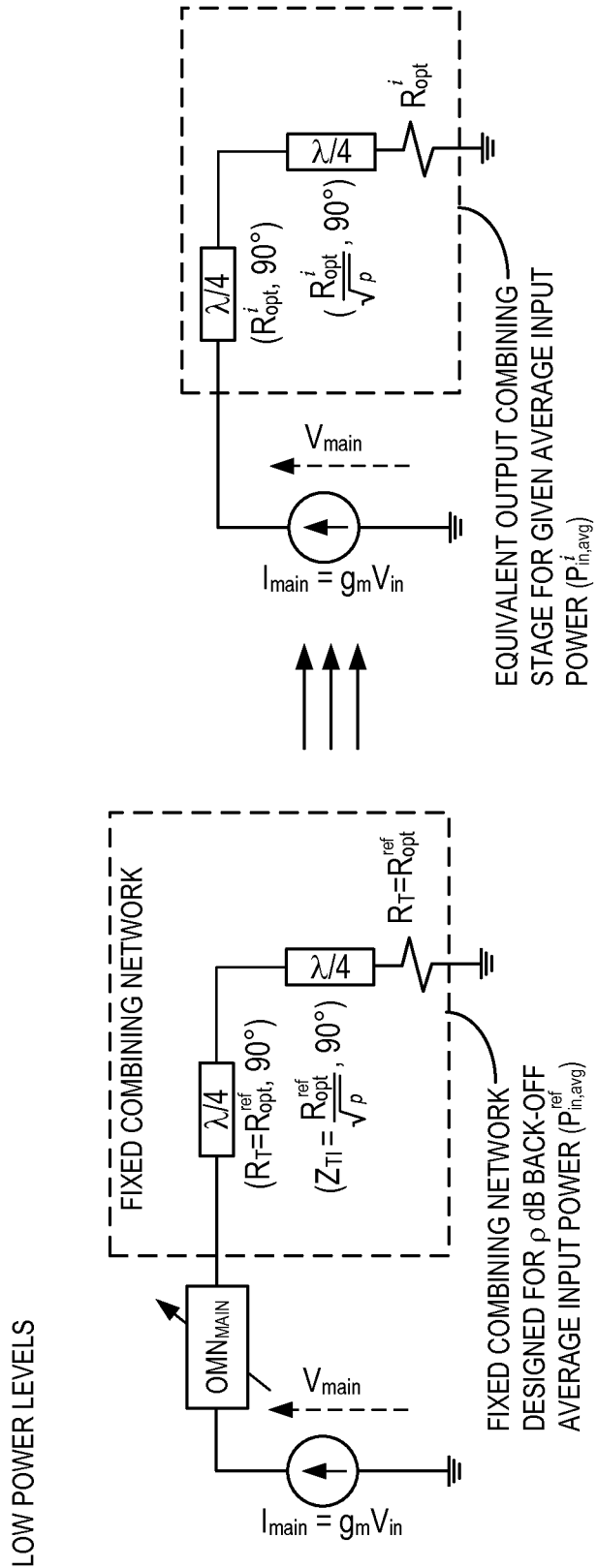
Figure 6B:
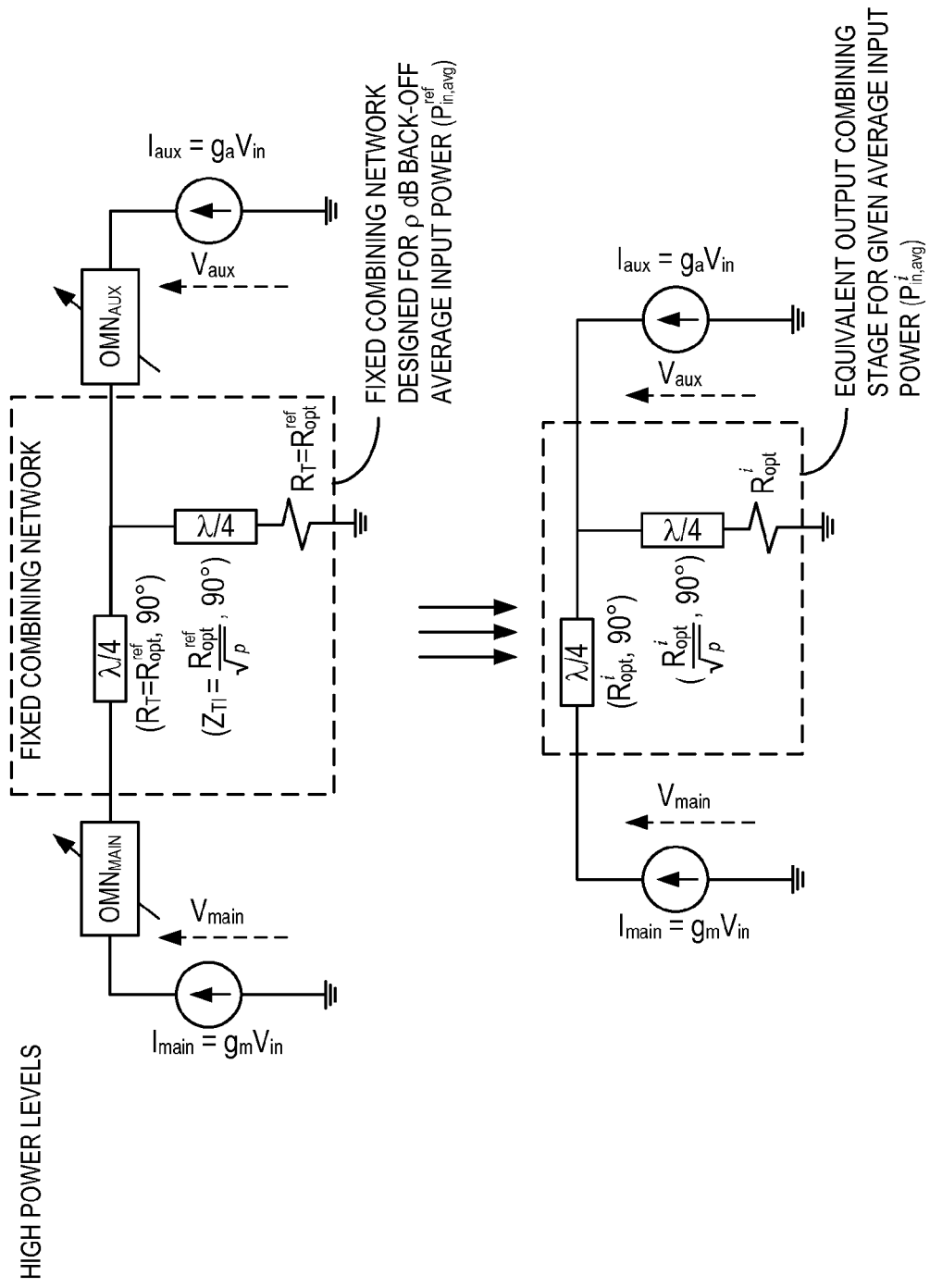

FIGS. 6A and 6B graphically illustrate a process for designing the reconfigurable main and auxiliary output matching networks (OMN$_{MAIN}$ and OMN$_{AUX}$) 112 and 146 according to one embodiment of the present disclosure. In general, a set of close form equations allows the determination of ABCD parameters of the reconfigurable main and auxiliary output matching networks (OMN$_{MAIN}$ and OMN$_{AUX}$) 112 and 146 given the reference value of the average input power (represented by p) and the desired power reduction ratio α that, in turn, determines the set of values of the optimal load impedance R$_{opt}^i$ with respect to the reference load impedance R$_{opt}^{ref}$·P$_{in,avg}^{ref}$=P$_{in,avg}^0$.

In this analysis, the set of R$_{opt}^i$ values that correspond to the different back-off power levels P$_{in,avg}^i$ is described in terms of R$_{opt}^{ref}$ following Equation (5). Notably, the index i is an index of the back-off power level P$_{in,avg}^i$ relative to the reference back-off power level P$_{in,avg}^{ref}$=P$_{in,avg}^0$. First, FIG. 6A is an illustration from which a number of expressions are derived to deduce the ABCD parameters of the reconfigurable main output matching network (OMN$_{MAIN}$) 112 according to one embodiment of the present disclosure. In general, for low power levels, the cascade of the reconfigurable main output matching network (OMN$_{MAIN}$) 112 and the fixed combining network 90 is designed to be equivalent to the optimal combining network for the given back-off power levels P$_{in,avg}^i$. More specifically, for low power levels, the auxiliary power amplifier 140 is off (i.e., is not conducting) such that the output impedance seen by the main power amplifier 106 is the cascade of the reconfigurable main output matching network (OMN$_{MAIN}$) 112 and the fixed combining network 90. As such, for low power level compensation, the ABCD parameters for the optimal combining stage for the Doherty power amplifier 82 targeting the average power P$_{in,avg}^i$ can be expressed, in terms of the index i, as follows:

$$\begin{bmatrix} A & B \\ C & D \end{bmatrix}_{\text{Low Power Combining Stage } P_{in,avg}^i} = \begin{bmatrix} 0 & jR_{opt}^i \\ \frac{-1}{jR_{opt}^i} & 0 \end{bmatrix} \begin{bmatrix} 0 & j\frac{R_{opt}^i}{\sqrt{p}} \\ \frac{-\sqrt{p}}{jR_{opt}^i} & 0 \end{bmatrix} \begin{bmatrix} 1 & R_{opt}^i \\ 0 & 1 \end{bmatrix} \quad (6)$$

$$= \begin{bmatrix} -\sqrt{p} & 0 \\ 0 & -\frac{1}{\sqrt{p}} \end{bmatrix} \begin{bmatrix} 1 & R_{opt}^i \\ 0 & 1 \end{bmatrix}$$

$$= \begin{bmatrix} -\sqrt{p} & -\sqrt{p}\,R_{opt}^i \\ 0 & \frac{-1}{\sqrt{p}} \end{bmatrix}$$

where $\begin{bmatrix} 0 & jR_{opt}^i \\ \frac{-1}{jR_{opt}^i} & 0 \end{bmatrix}$ is an ABCD matrix for the optimal impedance inverter $(R_T=R_{opt}^i, 90°)$, $$\begin{bmatrix} 0 & j\frac{R_{opt}^i}{\sqrt{p}} \\ \frac{-\sqrt{p}}{jR_{opt}^i} & 0 \end{bmatrix}$$

is an ABCD matrix for the optimal impedance inverter $(Z_{T1}=Z_{opt}^i, 90°)$, and $$\begin{bmatrix} 1 & R_{opt}^i \\ 0 & 1 \end{bmatrix}$$

is an ABCD matrix for the optimal resistance $R_T=R_{opt}^i$ for the optimal combining network for the back-off power levels $P_{in,avg}^i$.

To maintain proper load modulation, the ABCD matrix of the cascade output stage, composed of the reconfigurable main output matching network (OMN$_{MAIN}$) 112 and the fixed combining network 90, should be kept equal to those presented in Equation (6), which gives:

$$\begin{bmatrix} -\sqrt{p} & -\sqrt{p}\,R_{opt}^i \\ 0 & \frac{-1}{\sqrt{p}} \end{bmatrix} = \begin{bmatrix} A & B \\ C & D \end{bmatrix}_{Main\ OMN} \begin{bmatrix} -\sqrt{p} & -\sqrt{p}\,R_{opt}^{ref} \\ 0 & \frac{-1}{\sqrt{p}} \end{bmatrix} \quad (7)$$

$$\begin{bmatrix} A & B \\ C & D \end{bmatrix}_{Main\ OMN} = \begin{bmatrix} -\sqrt{p} & -\sqrt{p}\,R_{opt}^i \\ 0 & \frac{-1}{\sqrt{p}} \end{bmatrix} \begin{bmatrix} -\sqrt{p} & -\sqrt{p}\,R_{opt}^{ref} \\ 0 & \frac{-1}{\sqrt{p}} \end{bmatrix}$$

$$= \begin{bmatrix} -\sqrt{p} & -\sqrt{p}\,R_{opt}^i \\ 0 & \frac{-1}{\sqrt{p}} \end{bmatrix} \begin{bmatrix} \frac{-1}{\sqrt{p}} & \sqrt{p}\,R_{opt}^{ref} \\ 0 & -\sqrt{p} \end{bmatrix} \quad (8)$$

where $$\begin{bmatrix} -\sqrt{p} & -\sqrt{p}\,R_{opt}^i \\ 0 & \frac{-1}{\sqrt{p}} \end{bmatrix}$$

is the ABCD matrix of the optimal combining network for the back-off power levels $P_{in,avg}^i$ given by Equation (6) and $$\begin{bmatrix} -\sqrt{p} & -\sqrt{p}\,R_{opt}^{ref} \\ 0 & \frac{-1}{\sqrt{p}} \end{bmatrix}$$

is an ABCD matrix for the fixed combining network 90.

Hence, from Equation (8), one can deduce the circuit parameters of the reconfigurable main output matching network (OMN$_{MAIN}$) 112 for the back-off power level $P_{in,avg}^i$ using the following equation:

$$\begin{bmatrix} A & B \\ C & D \end{bmatrix}_{Main\ OMN} = \begin{bmatrix} 1 & p[R_{opt}^i - R_{opt}^{ref}] \\ 0 & 1 \end{bmatrix} = \begin{bmatrix} 1 & pR_{opt}^{ref}\left[\frac{1}{\alpha^i} - 1\right] \\ 0 & 1 \end{bmatrix} \quad (9)$$

Next, FIG. 6B is an illustration from which a number of expressions are derived to deduce the ABCD parameters of the reconfigurable auxiliary output matching network (OMN$_{AUX}$) according to one embodiment of the present disclosure. In general, for high power levels (i.e., power levels at which the auxiliary power amplifier 140 is conducting), the combination of the reconfigurable main output matching network (OMN$_{MAIN}$) 112, the reconfigurable auxiliary output matching network (OMN$_{AUX}$) 146, and the fixed combining network 90 is designed to be equivalent to the optimal combining network for the given back-off power levels $P_{in,avg}^i$. More specifically, at high power levels, the ABCD parameters for the optimal combining network for the Doherty power amplifier 82 targeting the average power $P_{in,avg}^i$, in terms of the index i, are as follows:

$$\begin{bmatrix} A & B \\ C & D \end{bmatrix}_{High\ Power\ Combining\ Stage\ P_{in,avg}^i} = \begin{bmatrix} 0 & jR_{opt}^i \\ \frac{-1}{jR_{opt}^i} & 0 \end{bmatrix} \begin{bmatrix} 1 & 0 \\ \frac{p}{R_{opt}^i} & 1 \end{bmatrix} \quad (10)$$

$$= \begin{bmatrix} jp & jR_{opt}^i \\ \frac{-1}{jR_{opt}^i} & 0 \end{bmatrix}$$

where $$\begin{bmatrix} 0 & jR_{opt}^i \\ \frac{-1}{jR_{opt}^i} & 0 \end{bmatrix}$$

is an ABCD matrix for the optimal impedance inverter $(R_T=R_{opt}^i, 90°)$, $$\begin{bmatrix} 1 & 0 \\ \frac{p}{R_{opt}^i} & 1 \end{bmatrix}$$

is an ABCD matrix for the combination of the optimal impedance inverter $(R_T=R_{opt}^i/\sqrt{p}, 90°)$ and the load impedance $R_{opt}^i$ (i.e., the branch including the vertical impedance inverter in FIG. 6B).

To maintain proper load modulation, the ABCD matrix of the cascade output stage, composed of the reconfigurable main and auxiliary output matching networks (OMN$_{MAIN}$ and OMN$_{AUX}$) 112 and 146 and the fixed combining network 90, should be kept equal to those presented in Equation (10) such that:

$$\begin{bmatrix} jp & jR_{opt}^i \\ \frac{-1}{jR_{opt}^i} & 0 \end{bmatrix} = \begin{bmatrix} A & B \\ C & D \end{bmatrix}_{Main\ OMN} \begin{bmatrix} jp & jR_{opt}^{ref} \\ \frac{-1}{jR_{opt}^{ref}} & 0 \end{bmatrix} \begin{bmatrix} A & B \\ C & D \end{bmatrix}_{Aux\ OMN} \quad (11)$$

Substituting Equation (9) into Equation (11) yields:

$$\begin{bmatrix} jp & jR_{opt}^{i} \\ \frac{-1}{jR_{opt}^{i}} & 0 \end{bmatrix} = \begin{bmatrix} 1 & p \end{bmatrix} \begin{bmatrix} \frac{R_{opt}^{i}}{R_{opt}^{ref}} - \\ 0 & 1 \end{bmatrix} \begin{bmatrix} jp & jR_{opt}^{ref} \\ \frac{-1}{jR_{opt}^{ref}} & 0 \end{bmatrix} \begin{bmatrix} A & B \\ C & D \end{bmatrix}_{Aux\,OMN} \quad (12)$$

$$= \begin{bmatrix} jp\left(\frac{R_{opt}^{i}}{R_{opt}^{ref}}\right) & jR_{opt}^{ref} \\ \frac{-1}{jR_{opt}^{ref}} & 0 \end{bmatrix} \begin{bmatrix} A & B \\ C & D \end{bmatrix}_{Aux\,OMN}$$

Then, solving for the ABCD matrix for the reconfigurable auxiliary output matching network (OMN$_{AUX}$) 146 gives:

$$\begin{bmatrix} A & B \\ C & D \end{bmatrix}_{Aux\,OMN} = \begin{bmatrix} jp\left(\frac{R_{opt}^{i}}{R_{opt}^{ref}}\right) & jR_{opt}^{ref} \\ \frac{-1}{jR_{opt}^{ref}} & 0 \end{bmatrix} \begin{bmatrix} jp & jR_{opt}^{i} \\ \frac{-1}{jR_{opt}^{i}} & 0 \end{bmatrix} \quad (13)$$

$$= \begin{bmatrix} 0 & jR_{opt}^{ref} \\ \frac{1}{jR_{opt}^{ref}} & jp\left(\frac{R_{opt}^{i}}{R_{opt}^{ref}}\right) \end{bmatrix} \begin{bmatrix} jp & jR_{opt}^{i} \\ \frac{-1}{jR_{opt}^{i}} & 0 \end{bmatrix}$$

Hence, the circuit parameters for the reconfigurable auxiliary output matching network (OMN$_{AUX}$) 146 can be determined using the following equation:

$$\begin{bmatrix} A & B \\ C & D \end{bmatrix}_{Aux\,OMN} = \begin{bmatrix} \frac{R_{opt}^{ref}}{R_{opt}^{i}} & 0 \\ \frac{p}{R_{opt}^{ref}} - \frac{p}{R_{opt}^{i}} & \frac{R_{opt}^{i}}{R_{opt}^{ref}} \end{bmatrix} \quad (14)$$

$$= \begin{bmatrix} \alpha^{i-1} & 0 \\ \frac{p}{R_{opt}^{ref}}[1-\alpha^{i}] & \frac{1}{\alpha^{i}} \end{bmatrix}$$

Equations (9) and (14) are closed form equations for obtaining the circuit parameters for the reconfigurable main output matching network (OMN$_{MAIN}$) 112 and the reconfigurable auxiliary output matching network (OMN$_{AUX}$) 146, respectively, to maintain proper load modulation for each back-off power level $P_{in,avg}^{i}$ (for i=0,1, . . . , n). The circuit parameters are represented by the corresponding power decrement $1/\alpha^{i}$ corresponding to the back-off power level $P_{in,avg}^{i}$, the reference average power level (p), and the reference optimal load resistance ($R_{opt}^{ref}$).

Figure 7:
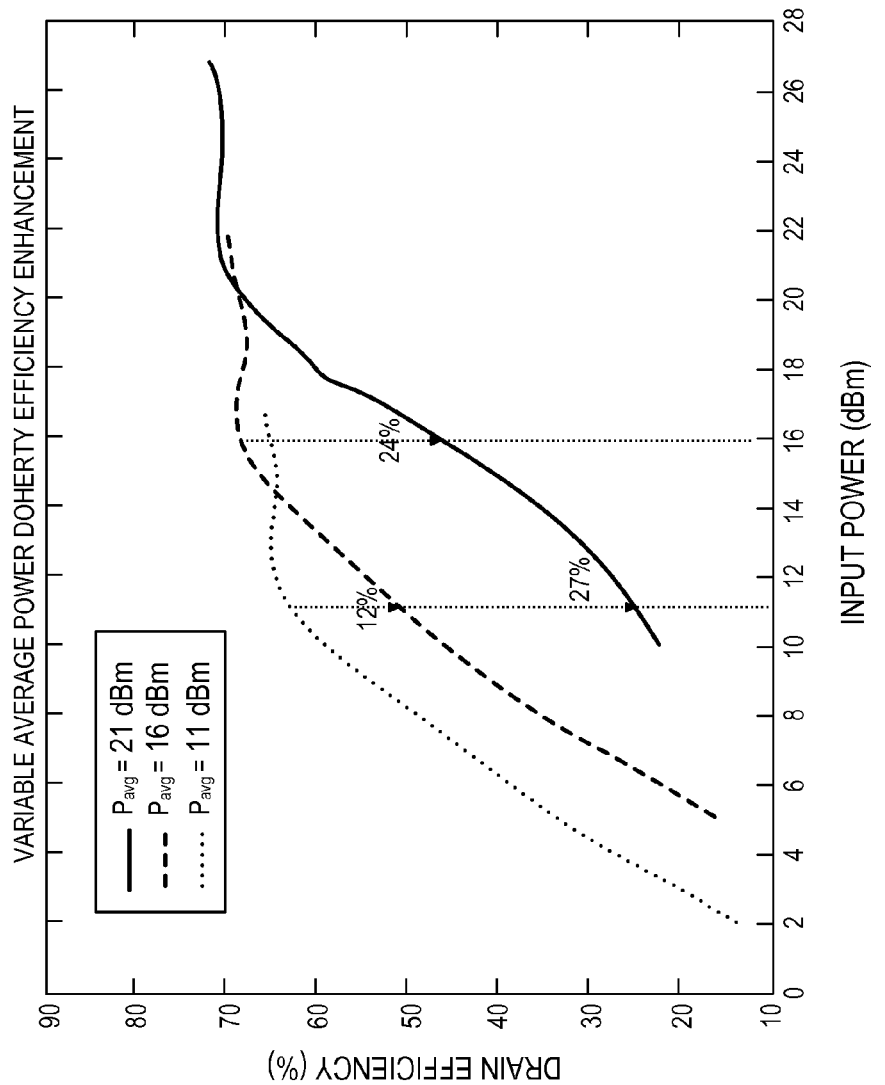
FIG. 7 illustrates an efficiency enhancement of the Doherty power amplifier of FIG. 3 according to one embodiment of the present disclosure.

FIG. 7 graphically illustrates drain efficiency improvement of one embodiment of the Doherty power amplifier 82 of FIG. 3. As illustrated, in this example, the reference back-off power level is approximately 21 decibel-milliwatts (dBm), the first extended back-off power level is approximately 16 dBm, and the second extended back-off power level is approximately 11 dBm. At the first extended back-off power level, the Doherty power amplifier 82 has a 24% drain efficiency improvement over the conventional, or reference, Doherty power amplifier 10 of FIG. 1. At the second extended back-off power level, the Doherty power amplifier 82 has a 39% drain efficiency improvement over the conventional, or reference, Doherty power amplifier 10.

Figure 8:
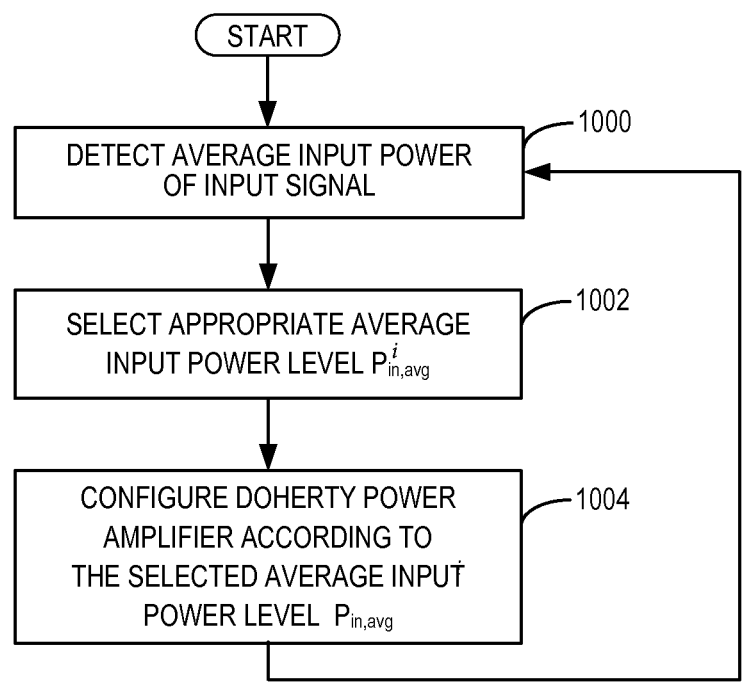
FIG. 8 is a flow chart that illustrates a process for dynamically configuring the Doherty power amplifier of FIG. 3 during operation according to one embodiment of the present disclosure.

FIG. 8 is a flow chart that illustrates the operation of the controller 184 to dynamically configure the Doherty power amplifier 82 according to one embodiment of the present disclosure. First, the controller 184 detects an average input power of the input signal V$_{in}$ of the Doherty power amplifier 82 (step 1000). Next, the controller 184 selects an appropriate average input power level $P_{in,avg}^{i}$ based on the detected average input power of the input signal V$_{in}$ (step 1002). More specifically, if the average input power of the input signal V$_{in}$ is less than $P_{in,avg}^{n}$, then the controller 184 selects $P_{in,avg}^{n}$ as the appropriate average input power level. Otherwise, the controller 184 selects the highest average input power level $P_{in,avg}^{i}$ that is less than or equal to the average input power of the input signal V$_{in}$. The selection of the appropriate average input power level ($P_{in,avg}^{selected}$) can be expressed as:

if $P_{in,avg} < P_{in,avg}^{n}$, then
$P_{in,avg}^{selected} = P_{in,avg}^{n}$, and
otherwise, if $P_{in,avg} \geq P_{in,avg}^{n}$, then
$P_{in,avg}^{selected} = \max(P_{in,avg}^{i})$ that is $\leq P_{in,avg}$.

Once the appropriate average input power level is selected, the controller 184 configures the Doherty power amplifier 82 according to the selected average input power level (step 1004). More specifically, the controller 184 configures the reconfigurable main output matching network (OMN$_{MAIN}$) 112 and the reconfigurable auxiliary output matching network (OMN$_{AUX}$) 146 to provide proper load modulation for the selected average input power level, as described above. In addition, the controller 184 configures the variable voltage source 154 to provide the proper gate bias to the auxiliary power amplifier 140 for the selected average input power level. Still further, the controller 184 configures the reconfigurable main input matching network (IMN$_{MAIN}$) 100 to provide phase balancing between the main and auxiliary power amplifier branches 86 and 88 for the selected average input power level. The process then repeats such that the controller 184 dynamically reconfigures the Doherty power amplifier 82 based on the average input power of the input signal V$_{in}$. In this manner, the Doherty power amplifier 82 maintains high efficiency over the entire back-off power level range from $P_{in,avg}^{n}$ to $P_{in,max}$.

Figure 9:
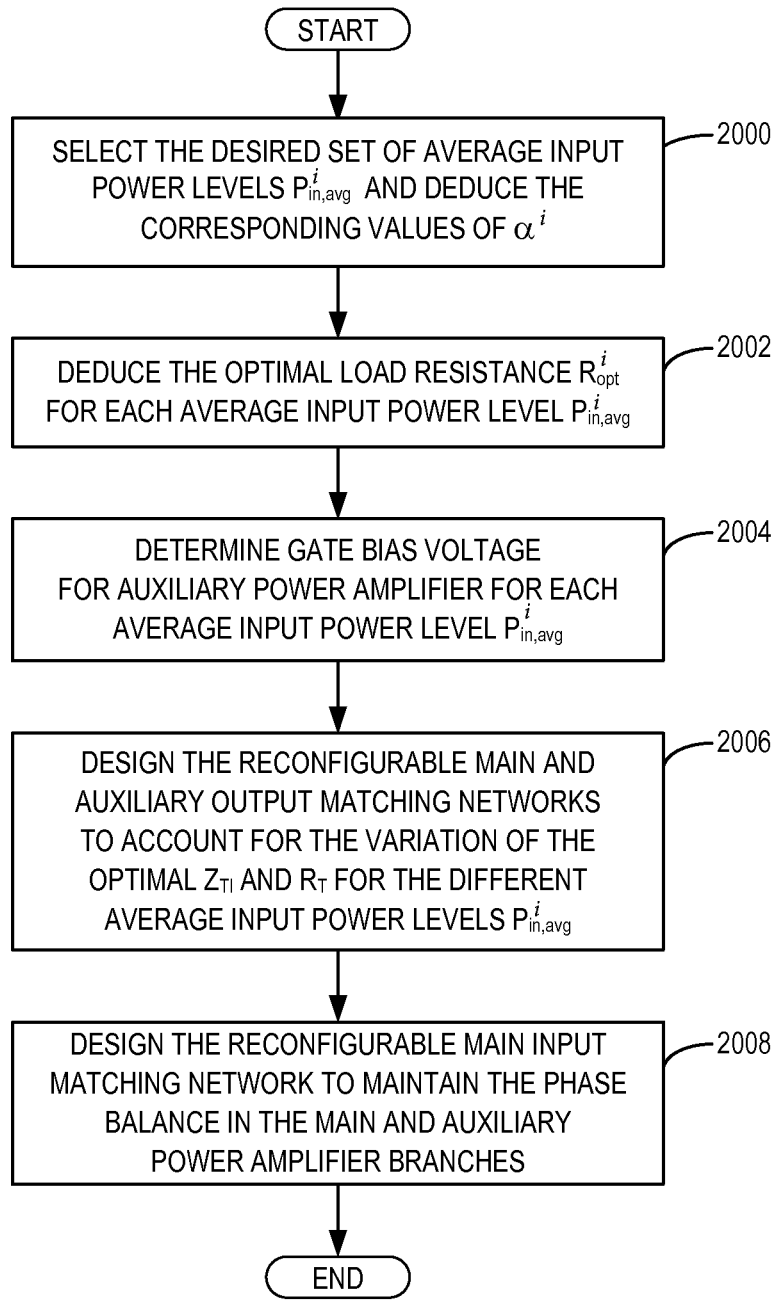
FIG. 9 is a flow chart that illustrates a process for designing the Doherty power amplifier of FIG. 3 according to one embodiment of the present disclosure.

FIG. 9 is a flow chart that illustrates a process for designing the Doherty power amplifier 82 according to one embodiment of the present disclosure. First, a desired set of average input power levels for $P_{in,avg}^{i}$ for i=1,2, . . . , n are selected, and corresponding $\alpha^{i}$ values are deduced (step 2000). Next, the optimal load resistance $R_{opt}^{i}$ for each average input power level $P_{in,avg}^{i}$ is deduced (step 2002). Next, the proper gate bias voltage for the auxiliary power amplifier 140 is determined for each average input power level $P_{in,avg}^{i}$ (step 2004). The reconfigurable main and auxiliary output matching networks (OMN$_{MAIN}$ and OMN$_{AUX}$) 112 and 146 are then designed according to Equations (9) and (14) to thereby account for the variations of the optimal values of R$_T$ and Z$_{T1}$ for the average input power levels $P_{in,avg}^{i}$ (step 2006). Note that while Equations (9) and (14) represent one preferred embodiment for determining the circuit parameters for the reconfigurable main and auxiliary output matching networks (OMN$_{MAIN}$ and OMN$_{AUX}$) 112 and 146, the present disclosure is not limited thereto. Lastly, the reconfigurable main input matching network (IMN$_{MAIN}$) is designed to maintain the phase balance between the main and auxiliary power amplifier branches 86 and 88 for the different average input power levels $P_{in,avg}^{i}$ (step 2008).

While not being limited by or to any particular advantage, the Doherty power amplifier 82 disclosed herein has several advantages. As one example, in one implementation, the Doherty power amplifier 82 employs a minimum number of electronically tunable devices (i.e., the RF MEMS switches). As another example, the Doherty power amplifier 82 uses a fixed, or non-configurable, combining network 90, which enhances power handling capabilities and reduces the size of the tunable part of the power amplifier circuitry. This is particularly beneficial when the Doherty power amplifier 82 is implemented using integrated circuitry technologies. For example, in one embodiment, the reconfigurable input and output matching networks 100, 112, and 146 are implemented together with the main and auxiliary power amplifiers 106 and 140 in an integrated circuit. By implementing the tunable part of the Doherty power amplifier 82 on the integrated circuit rather than in the fixed combining network 90, the size of the fixed combining network 90 is substantially reduced.

The following acronyms are used throughout this disclosure.
ASIC Application Specific Integrated Circuit
dB Decibel
dBm Decibel-Milliwatt
CPU Central Processing Unit
MEM Microelectromechanical
PA Power Amplifier
PAPR Peak-to-Average Power Ratio
RF Radio Frequency Those skilled in the art will recognize improvements and modifications to the preferred embodiments of the present disclosure. All such improvements and modifications are considered within the scope of the concepts disclosed herein and the claims that follow.

What is claimed is:

1. A Doherty power amplifier comprising:
an input power divider having an input, a first output, and a second output;
a main power amplifier branch comprising:
a main power amplifier having an input coupled to the first output of the input power divider and an output; and
a reconfigurable main output matching network having an input coupled to the output of the main power amplifier and an output;
an auxiliary power amplifier branch comprising:
an auxiliary power amplifier having an input coupled to the second output of the input power divider and an output; and
a reconfigurable auxiliary output matching network having an input coupled to the output of the auxiliary power amplifier and an output;
a fixed combining network having a first input coupled to the output of the reconfigurable main output matching network and a second input coupled to the output of the reconfigurable auxiliary output matching network; and
a variable voltage source configured to apply a variable gate bias voltage to the auxiliary power amplifier, wherein the reconfigurable main output matching network, the reconfigurable auxiliary output matching network, and the variable voltage source are reconfigurable for a plurality of average input power levels.

2. The Doherty power amplifier of claim 1 wherein, for each average input power level of the plurality of average input power levels, the reconfigurable main output matching network and the reconfigurable auxiliary output matching network and the variable voltage source are reconfigurable to provide proper load modulation for the average input power level.

3. The Doherty power amplifier of claim 1 wherein, for each average input power level of the plurality of average input power levels, the reconfigurable main output matching network and the reconfigurable auxiliary output matching network are reconfigurable such that a combination of the reconfigurable main output matching network, the reconfigurable auxiliary output matching network, and the fixed combining network is equivalent to an optimal combining network for the average input power level.

4. The Doherty power amplifier of claim 3 wherein the fixed combining network comprises:
a first impedance inverter having a first terminal coupled to the output of the reconfigurable main output matching network and a second terminal;
a second impedance inverter having a first terminal and a second terminal, the first terminal of the second impedance inverter coupled to both the output of the reconfigurable auxiliary output matching network and the second terminal of the first impedance inverter; and
a resistor having a first terminal coupled to the second terminal of the second impedance inverter and a second terminal coupled to ground.

5. The Doherty power amplifier of claim 3 wherein circuit parameters for load impedance, $R_T$, and characteristic impedance, $Z_{T1}$, of the fixed combining network are optimal values for proper load modulation for a reference average input power level at a predefined back-off level $\rho(dB)$ from a maximum input power level $P_{in,max}$ of the Doherty power amplifier.

6. The Doherty power amplifier of claim 5 wherein the plurality of average input power levels are defined as $P_{in,avg}^i = P_{in,max} - (\rho + i\gamma)$ for $i=0,1,\ldots,n$ where $n \geq 1$.

7. The Doherty power amplifier of claim 6 wherein:
an ABCD matrix for the reconfigurable main output matching network is defined as:

$$\begin{bmatrix} A & B \\ C & D \end{bmatrix}_{Main\ OMN} = \begin{bmatrix} 1 & p[R_{opt}^i - R_{opt}^{ref}] \\ 0 & 1 \end{bmatrix}; \text{ and}$$

an ABCD matrix for the reconfigurable auxiliary output matching network is defined as:

$$\begin{bmatrix} A & B \\ C & D \end{bmatrix}_{Aux\ OMN} = \begin{bmatrix} \dfrac{R_{opt}^{ref}}{R_{opt}^i} & 0 \\ \dfrac{p}{R_{opt}^{ref}} - \dfrac{p}{R_{opt}^i} & \dfrac{R_{opt}^i}{R_{opt}^{ref}} \end{bmatrix},$$

where p is an arbitrary average power level reduction ratio defined by the equation $\rho(dB) = 20\log p$, $R_{opt}^{ref}$ is an optimal load resistance for the reference average input power level, and $R_{opt}^i$ is an optimal load resistance for the i-th average input power level $P_{in,avg}^i$.

8. The Doherty power amplifier of claim 1 wherein:
the main power amplifier branch further comprises a main input matching network having an input coupled to the first output of the input power divider and an output coupled to the input of the main power amplifier; and
the auxiliary power amplifier branch further comprises an auxiliary input matching network having an input coupled to the second output of the input power divider and an output coupled to the input of the auxiliary power amplifier.

9. The Doherty power amplifier of claim 8 wherein the main input matching network is reconfigurable.

10. The Doherty power amplifier of claim 9 wherein the main input matching network is reconfigurable to maintain phase balance between the main power amplifier branch and the auxiliary power amplifier branch for a plurality of average input power levels.

11. The Doherty power amplifier of claim 10 wherein the reconfigurable main output matching network, the reconfigurable auxiliary output matching network, the main input matching network, and a variable gate bias voltage of the auxiliary power amplifier are reconfigurable for a plurality of average input power levels.

12. The Doherty power amplifier of claim 1 wherein each of the reconfigurable main output matching network and the reconfigurable auxiliary output matching network comprises a Microelectromechanical, MEM, switch.

13. The Doherty power amplifier of claim 1 wherein the reconfigurable main output matching network and the reconfigurable auxiliary output matching network are dynamically configured during operation based on an input signal provided to the input of the input power divider.

14. A method of configuring of a Doherty power amplifier comprising a reconfigurable main output matching network, a reconfigurable auxiliary output matching network, and a fixed combining network, comprising:
    detecting an input power of an input signal provided to an input of the Doherty power amplifier;
    selecting one of a plurality of average input power levels based on the input power of the input signal;
    configuring the reconfigurable main output matching network and the reconfigurable auxiliary output matching network based on the one of the plurality of average input power levels selected based on the input power of the input signal; and
    configuring a variable gate bias voltage for an auxiliary power amplifier of the Doherty power amplifier to provide proper turn-on of the auxiliary power amplifier for the one of the plurality of average input power levels selected based on the input power of the input signal.

15. The method of claim 14 wherein configuring the reconfigurable main output matching network and the reconfigurable auxiliary output matching network comprises configuring the reconfigurable main output matching network and the reconfigurable auxiliary output matching network to provide proper load modulation for the one of the plurality of average input power levels selected based on the input power of the input signal.

16. The method of claim 14 wherein configuring the reconfigurable main output matching network and the reconfigurable auxiliary output matching network comprises configuring the reconfigurable main output matching network and the reconfigurable auxiliary output matching network such that a combination of the reconfigurable main output matching network, the reconfigurable auxiliary output matching network, and the fixed combining network is equivalent to an optimal combining network for the Doherty power amplifier for the one of the plurality of average input power levels selected based on the input power of the input signal.

17. The method of claim 14 further comprising configuring a reconfigurable main input matching network of the Doherty power amplifier to phase balance a main power amplifier branch and an auxiliary power amplifier branch of the Doherty power amplifier.

* * * * *